(12) United States Patent
Heinrich et al.

(10) Patent No.: US 8,367,504 B2
(45) Date of Patent: Feb. 5, 2013

(54) METHOD FOR FORMING SEMICONDUCTOR FUSES IN A SEMICONDUCTOR DEVICE COMPRISING METAL GATES

(75) Inventors: Jens Heinrich, Wachau (DE); Ralf Richter, Dresden (DE); Kai Frohberg, Niederau (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 231 days.

(21) Appl. No.: 12/895,116

(22) Filed: Sep. 30, 2010

(65) Prior Publication Data

US 2011/0101460 A1    May 5, 2011

(30) Foreign Application Priority Data

Oct. 30, 2009    (DE) .......................... 10 2009 046 248

(51) Int. Cl.
*H01L 21/336*    (2006.01)
*H01L 21/8238*    (2006.01)
*H01L 21/301*    (2006.01)
*H01L 21/44*    (2006.01)

(52) U.S. Cl. ........ 438/281; 438/215; 438/333; 438/467; 438/601; 257/E21.592

(58) Field of Classification Search .................. 438/585, 438/591, 132, 215, 281, 333, 467, 601; 257/E21.592, 529
See application file for complete search history.

(56) References Cited

U.S. PATENT DOCUMENTS

| | | | | |
|---|---|---|---|---|
| 7,902,058 B2* | 3/2011 | Datta et al. | ..................... | 438/592 |
| 8,071,437 B2* | 12/2011 | Lin et al. | ........................ | 438/238 |
| 8,153,498 B2* | 4/2012 | Hsu et al. | ....................... | 438/382 |
| 8,163,640 B2* | 4/2012 | Chen et al. | .................... | 438/592 |
| 2010/0059823 A1* | 3/2010 | Chung et al. | .................. | 257/355 |

\* cited by examiner

*Primary Examiner* — Shouxiang Hu
(74) *Attorney, Agent, or Firm* — Williams, Morgan & Amerson

(57) ABSTRACT

In a replacement gate approach, the semiconductor material of the gate electrode structures may be efficiently removed during a wet chemical etch process, while this material may be substantially preserved in electronic fuses. Consequently, well-established semiconductor-based electronic fuses may be used instead of requiring sophisticated metal-based fuse structures. The etch selectivity of the semiconductor material may be modified on the basis of ion implantation or electron bombardment.

12 Claims, 6 Drawing Sheets

METHOD FOR FORMING SEMICONDUCTOR FUSES IN A SEMICONDUCTOR DEVICE COMPRISING METAL GATES

BACKGROUND OF THE INVENTION

1. Field of the Invention

The present disclosure generally relates to the field of fabricating integrated circuits, and, more particularly, to electronic fuses in complex integrated circuits that comprise metal gate electrode structures.

2. Description of the Related Art

In modern integrated circuits, a very high number of individual circuit elements, such as field effect transistors in the form of CMOS, NMOS, PMOS elements, resistors, capacitors and the like, are formed on a single chip area. Typically, feature sizes of these circuit elements are steadily decreasing with the introduction of every new circuit generation, to provide currently available integrated circuits with a high performance in terms of speed and/or power consumption. A reduction in size of transistors is an important aspect in steadily improving device performance of complex integrated circuits, such as CPUs. The reduction in size commonly brings about an increased switching speed, thereby enhancing signal processing performance.

In addition to the large number of transistor elements, a plurality of passive circuit elements, such as capacitors and resistors, are typically formed in integrated circuits as required by the basic circuit layout. Due to the decreased dimensions of circuit elements, not only the performance of the individual transistor elements may be improved, but also their packing density may be significantly increased, thereby providing the potential for incorporating increased functionality into a given chip area. For this reason, highly complex circuits have been developed, which may include different types of circuits, such as analog circuits, digital circuits and the like, thereby providing entire systems on a single chip (SOC).

Although transistor elements are the dominant circuit element in highly complex integrated circuits and substantially determine the overall performance of these devices, other components, such as capacitors, resistors and electronic fuses, may be required, wherein the size of these passive circuit elements may also have to be adjusted with respect to the scaling of the transistor elements in order to not unduly consume valuable chip area. Moreover, the passive circuit elements, such as the resistors, may have to be provided with a high degree of accuracy in order to meet tightly set margins according to the basic circuit design. For example, even in substantially digital circuit designs, corresponding resistance values may have to be provided within tightly set tolerance ranges so as to not unduly contribute to operational instabilities and/or enhanced signal propagation delay.

Similarly, electronic fuses may be used in complex integrated circuits as additional mechanisms so as to allow the circuit itself to adapt performance of certain circuit portions to comply with performance of other circuit portions, for instance after completing the manufacturing process and/or during use of the semiconductor device, for instance when certain critical circuit portions may no longer comply with corresponding performance criteria, thereby requiring an adaptation of certain circuit portions, such as re-adjusting an internal voltage supply, thereby resetting overall circuit speed and the like.

For this purpose, the so-called electronic fuses or e-fuses may be provided in the semiconductor devices, which may represent electronic switches that may be activated once in order to provide a desired circuit adaptation. Hence, the electronic fuses may be considered as having a high impedance state, which may typically also represent a "programmed" state, and may have a low impedance state, typically representing a non-programmed state of the electronic fuse. Since these electronic fuses may have a significant influence on the overall behavior of the entire integrated circuit, a reliable detection of the non-programmed and the programmed state may have to be guaranteed, which may have to be accomplished on the basis of appropriately designed logic circuitry. Furthermore, since typically these electronic fuses may be actuated once over the lifetime of the semiconductor device under consideration, a corresponding programming activity may have to ensure that a desired programmed state of the electronic fuse is reliably generated in order to provide well-defined conditions for the further operational lifetime of the device. The programming of a fuse typically involves the application of a voltage pulse, which in turn induces a current pulse of sufficient current density in order to cause a permanent modification of a specific portion of the fuse. Thus, the electronic behavior of the fuse and the corresponding conductors for supplying the current and voltage to the fuse has to be precisely defined to obtain a reliable programmed state of the fuse. For this purpose, polysilicon is usually used for the fuse bodies, for instance in combination with a metal silicide, in which electromigration effects, in combination with other effects caused by the current pulse, may then result in a permanent generation of a high-ohmic state of the fuse body.

The continuous drive to shrink the feature sizes of complex integrated circuits has resulted in a gate length of field effect transistors of approximately 50 nm and less. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, referred to as a channel region, that is disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon forming a conductive channel due to the application of an appropriate control voltage to the gate electrode, depends on the dopant concentration of the drain and source regions, the mobility of the charge carriers and, for a given transistor width, on the distance between the source region and the drain region, which is also referred to as channel length.

Presently, most complex integrated circuits are based on silicon due to the substantially unlimited availability, the well understood characteristics of silicon and related materials and processes, and due to the experience gathered during the last 50 years. Therefore, silicon will likely remain the material of choice for future circuit generations. One reason for the important role of silicon for the fabrication of semiconductor devices has been the superior characteristics of a silicon/silicon dioxide interface that allows a reliable electrical insulation of different regions from each other. The silicon/silicon dioxide interface is stable at high temperatures and, thus, allows high temperature processes to be performed, as are typically required for anneal processes in order to activate dopants and to cure crystal damage without sacrificing the electrical characteristics of the interface. Consequently, in field effect transistors, silicon dioxide has preferably been used as a gate insulation layer which separates the gate electrode, frequently comprised of polysilicon, from the silicon channel region. Upon further device scaling, however, the reduction of channel length may require a corresponding adaptation of the thickness of the silicon dioxide gate dielectric in order to substantially avoid a so-called "short channel" behavior, according to which a variability in channel length may have a significant influence on the resulting threshold voltage of the transistor. Aggressively scaled transistor devices with a relatively low supply voltage and, thus, a reduced threshold voltage, therefore, suffer from a significant increase of the leakage current caused by the reduced thickness of a silicon dioxide gate dielectric. For example, a channel length of approximately 0.08 μm may require a gate dielectric made of silicon dioxide as thin as approximately 1.2 nm in order to maintain the required capacitive coupling between the gate electrode and the channel region. Although high speed transistor elements having an extremely short channel may, in general, preferably be used in high speed signal paths, whereas transistor elements with a longer channel may be used for less critical signal paths, the relatively high leakage current caused by the direct tunneling of charge carriers through the ultra-thin silicon dioxide gate dielectric of the high speed transistor elements, may reach values for an oxide thickness in the range of 1-2 nm that may no longer be compatible with thermal design power requirements for any type of complex integrated circuit system.

For this reason, replacing silicon dioxide as the material for gate insulation layers has been considered, particularly for highly sophisticated applications. Possible alternative materials include such materials that exhibit a significantly higher permittivity, so that a physically greater thickness of a correspondingly formed gate insulation layer provides a capacitive coupling that would be obtained by an extremely thin silicon dioxide layer. It has been suggested to replace silicon dioxide with high permittivity materials, such as tantalum oxide, strontium titanium oxide, hafnium oxide, hafnium silicon oxide, zirconium oxide and the like.

Additionally, transistor performance may further be increased by providing an appropriate conductive material for the gate electrode in order to replace the usually used polysilicon material, since polysilicon may suffer from charge carrier depletion at the vicinity of the interface positioned between the gate dielectric material and the polysilicon material, thereby reducing the effective capacitance between the channel region and the gate electrode during transistor operation. Thus, a gate stack has been suggested in which a high-k dielectric material provides enhanced capacitance, while additionally maintaining any leakage currents at an acceptable level. Since the non-polysilicon material, such as titanium nitride and the like, may be formed such that it may be directly in contact with the gate dielectric material, the presence of a depletion zone may, thus, be avoided, while, at the same time, a moderately high conductivity may be achieved.

As is well known, the threshold voltage of the transistor may depend on the overall transistor configuration, on a complex lateral and vertical dopant profile of the drain and source regions, and the corresponding configuration of the PN junctions, and on the work function of the gate electrode material. Consequently, in addition to providing the desired dopant profiles, the work function of the metal-containing gate electrode material also has to be appropriately adjusted with respect to the conductivity type of the transistor under consideration. For this reason, typically, metal-containing electrode materials may be used for N-channel transistors and P-channel transistors, which may be provided according to well-established manufacturing strategies in a very advanced manufacturing stage. That is, in these approaches, the high-k dielectric material may be formed in combination with an appropriate metal-containing cap layer, such as titanium nitride and the like, followed by the deposition of a polysilicon material in combination with other materials, if required, which may then be patterned in order to form a gate electrode structure. Concurrently, corresponding resistors may be patterned, as described above. Thereafter, the basic transistor configuration may be completed by forming drain and source regions, performing anneal processes, and finally embedding the transistors in a dielectric material. Thereafter, an appropriate etch sequence may be performed, in which the top surfaces of the gate electrode structures, and all resistive structures, such as fuses, may be exposed and the polysilicon material may be removed. Subsequently, based on a respective masking regime, appropriate metal-containing electrode materials may be filled into gate electrode structures of N-channel transistors and P-channel transistors, respectively, in order to obtain a superior gate structure, including a high-k gate insulating material in combination with a metal-containing electrode material, which may provide an appropriate work function for N-channel transistors, and P-channel transistors, respectively. Concurrently, the resistive structures, such as the fuses, may also receive the metal-containing electrode material. Due to the enhanced conductivity of the metal-containing electrode material, however, the electronic characteristics, such as resistivity, electromigration behavior and the like, of the fuses may also exhibit a significantly reduced value, thereby requiring a reduction of line widths of these structures and/or an increase of the total length of these structures. While the former measure may result in patterning problems, since extremely small line widths may be required, the latter aspect may result in an increased consumption of valuable chip area.

Moreover, the redesign of the fuses in the form of metal fuses may, in addition to the above-indicated design measures, also require additional materials, since, typically, the programming of the fuses is associated with moderately high temperatures in a locally restricted manner caused by the high current pulse. For a fuse connecting to a copper-based metallization, the increased local heat generation may require additional measures in order to counter the increased diffusion activity of the copper species. For this reason, conventionally, an additional barrier layer is formed between the fuse body located in the device level and the copper-based metallization so that the well-established interlayer dielectric material system, in which the contacts are formed for connecting to the transistors and fuses, has to be modified in order to provide the required superior copper blocking capability, thereby contributing to further complexity, in addition to the required redesign of the fuses compared to well-established polysilicon-based fuses.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally relates to semiconductor devices and manufacturing techniques in which electronic fuses may be formed on the basis of appropriate semiconductor materials, such as a silicon material, a silicon/germanium material and the like, while complex metal gate electrode structures may be provided for at least some transistor elements. For this purpose, the gate electrode structures may be provided on the basis of a desired semiconductor material that is appropriate for the electronic fuses, wherein the semiconductor material may be replaced by one or more metal-containing electrode materials in a very advanced manufacturing stage in accordance with appropriate replacement gate approaches. On the other hand, the semiconductor material may be substantially preserved in the electronic fuses, which may be accomplished by selectively modifying the etch characteristics of the semiconductor material, at least at a surface area thereof, in the electronic fuses prior to performing a wet chemical etch process for removing the semiconductor material selectively in the gate electrode structures. The increase of the etch resistivity may be accomplished by an ion bombardment using an electrically inert species, such as xenon, which is to be understood as an atomic species that may not substantially alter the electronic characteristics of the base semiconductor material, while concurrently causing a significant reduction of a removal rate during the selective wet chemical etch process. In other illustrative aspects disclosed herein, the etch behavior of the semiconductor material may be efficiently modified by an electron bombardment which may, in some illustrative embodiments, be applied in a locally very selective manner, thereby avoiding the necessity of providing a mask layer for confining the electron beam to the device regions including the electronic fuses.

Consequently, replacement gate approaches may be efficiently applied in order to obtain sophisticated high-k metal gate stacks, while at the same time well-established semiconductor-based electronic fuses may be formed, thereby avoiding significant re-designs of electronic fuse structures and, in particular, avoiding the provision of additional material systems, such as additional diffusion barrier materials, which may frequently be used in metal fuses in combination with a copper metallization in conventional strategies.

One illustrative semiconductor device disclosed herein comprises a transistor element comprising a gate electrode structure, which in turn comprises a high-k gate dielectric material and a metal-containing electrode material formed above the high-k gate dielectric material. Moreover, the semiconductor device comprises an electronic fuse comprising a semiconductor material having an upper portion and a lower portion, wherein the upper portion has an increased etch resistivity compared to the lower portion.

One illustrative method disclosed herein relates to forming an electronic fuse of a semiconductor device. The method comprises forming a layer stack above a first device region and a second device region of the semiconductor device, wherein the layer stack comprises a high-k dielectric material and a semiconductor material. The method additionally comprises forming a replacement gate electrode structure above the first device region and a fuse body of an electronic fuse from the layer stack. Moreover, an etch resistivity of the semiconductor material is selectively increased in the fuse body. Furthermore, the method comprises performing a wet chemical etch process to remove the semiconductor material selectively in the replacement gate electrode structure, while the semiconductor material having the increased etch resistivity is substantially preserved in the fuse body.

A further illustrative method disclosed herein comprises forming a replacement gate electrode structure above a first device region and an electronic fuse above a second device region, wherein the replacement gate electrode structure and the electronic fuse comprise a semiconductor material. The method additionally comprises exposing a surface of the semiconductor material of the replacement gate electrode structure and of the electronic fuse. Furthermore, the surface of the semiconductor material is exposed to an electron bombardment selectively in the second device region. The method further comprises removing the semiconductor material selectively from the replacement gate electrode structure while substantially preserving the semiconductor material in the electronic fuse. Additionally, the method comprises forming a metal-containing electrode material in the replacement gate electrode structure.

BRIEF DESCRIPTION OF THE DRAWINGS

The disclosure may be understood by reference to the following description taken in conjunction with the accompanying drawings, in which like reference numerals identify like elements, and in which.

Figure 1A:
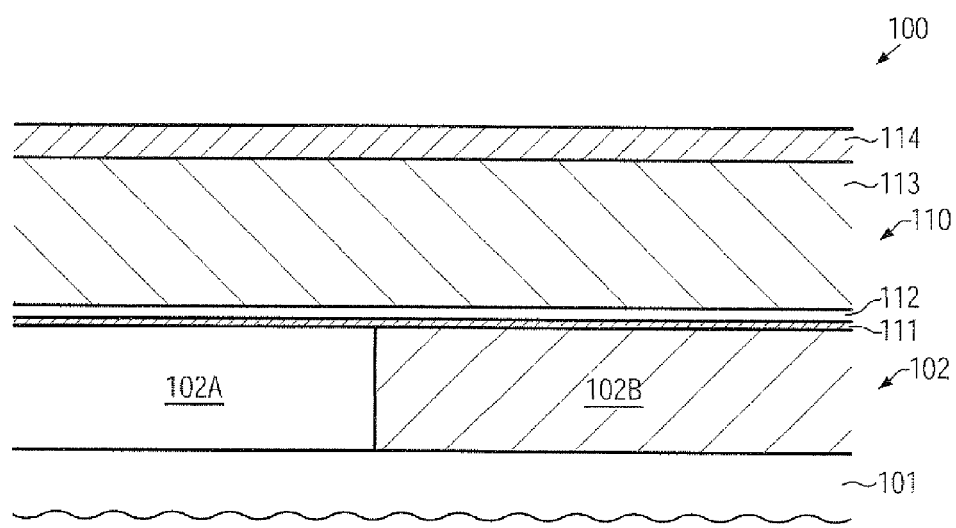
FIGS. 1a-1d schematically illustrate cross-sectional views of a semiconductor device during various manufacturing stages in forming a metal gate electrode structure and a semiconductor-based electronic fuse by increasing the etch resistivity of the semiconductor material selectively in the electronic fuse in an advanced manufacturing stage on the basis of an implantation process, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

According to the principles disclosed herein, semiconductor devices and manufacturing techniques are provided in which electronic fuses may be formed on the basis of a semiconductor material, such as polysilicon and the like, while complex metal-containing gate electrode structures of transistors may be provided in accordance with sophisticated replacement gate approaches. The semiconductor material in the electronic fuse may be substantially preserved by selectively increasing the etch resistivity of the semiconductor material, which may thus exhibit a significantly reduced removal rate during a wet chemical etch process that may be applied to efficiently remove the semiconductor material from the replacement gate electrode structures. For example, a plurality of selective wet chemical etch chemistries are available which exhibit high sensitivity with respect to a modification of the molecular structure and/or the presence of other atomic species so that a removal rate may be efficiently controlled on the basis of one or both of these mechanisms. In some illustrative embodiments disclosed herein, TMAH (tetra methyl ammonium hydroxide) may be used as an efficient wet chemical etch chemistry which actually represents a chemical that efficiently etches resist materials, which, however, may also be used in higher concentrations at elevated temperatures in order to etch silicon material with a high degree of selectivity with respect to silicon dioxide, silicon nitride and the like. Additionally, the presence of other atomic species, such as dopants and electrically inert atomic species, may have a significant influence on the actual etch rate, while a significant dependence on a disturbance of the molecular structure may result in a reduced etch rate. For example, species such as xenon may be efficiently incorporated into an upper part of the semiconductor material with a concentration that may be readily obtained on the basis of implantation processes. In this manner, a significantly increased etch resistivity may be imparted to the silicon-based semiconductor material on the basis of implantation techniques wherein appropriate process parameters may be readily selected so as to adapt dose and penetration depth of the implantation species to the device configuration under consideration. That is, the implantation species may be incorporated at any appropriate stage of the overall process flow, wherein the implantation energy may be efficiently adapted to the presence of any further materials, such as dielectric cap materials and the like, which may be provided above the semiconductor material whose effective etch resistivity is to be increased. Furthermore, an influence of the implantation process may be selectively avoided by providing an implantation mask, such as a resist mask, so that a high degree of flexibility may be achieved with respect to generating the desired selective etch behavior of a semiconductor material with different characteristics in the replacement gate electrode structures and the electronic fuses.

In other illustrative embodiments disclosed herein, a significant modification of the etch behavior of the semiconductor material may be accomplished by a selective electron bombardment, which may be accomplished by any appropriate electron source, such as electron microscopes, as are typically available in semiconductor production facilities and the like. Furthermore, by using such electron beam sources, a spatially highly restricted electron beam may be created, which in turn may be directed to a desired device region of the semiconductor device, without requiring the provision of an additional mask, which may result in a very efficient procedure for programming electronic fuses, for instance for test purposes and the like. In other illustrative embodiments, an electron bombardment may be obtained on the basis of an electron "shower," in combination with an appropriate mask, such as a resist mask.

Consequently, semiconductor-based electronic fuses may be provided, thereby avoiding additional complex process steps for re-designing electronic fuses, for instance, when based on gate metal materials and the like. Furthermore, the etch resistivity of the semiconductor material may be modified on the basis of well-established masking regimes, for instance resist masks, so that the provision of sophisticated hard mask materials may not be required in an advanced manufacturing stage, which may otherwise be necessary for selectively protecting the electronic fuses during the wet chemical etch process for removing the semiconductor material from the replacement gate electrode structures. Furthermore, by applying an implantation process, the etch resistivity may be modified at any appropriate stage of the manufacturing flow since implantation dose and energy may be appropriately adapted to the corresponding manufacturing stage of the replacement gate electrode structure and the electronic fuses.

FIG. 1a schematically illustrates a cross-sectional view of a semiconductor device 100 comprising a substrate 101 and a semiconductor layer 102, which, in combination, may represent a silicon-on-insulator (SOI) configuration, a bulk configuration or a combination thereof. For example, in an SOI configuration, a buried insulating layer (not shown) may be formed below and adjacent to the semiconductor layer 102, while, in a bulk configuration, the semiconductor layer 102 may be formed on a substantially crystalline material of the substrate 101. It should be appreciated that the "semiconductor layer" 102 may actually be comprised of a plurality of semiconductor regions which may be laterally separated by isolation structures comprised of any appropriate insulating material. For instance, the semiconductor layer 102 may represent a silicon-based material which may also comprise other components, such as germanium, carbon and the like, in order to obtain the desired electronic characteristics. For example, a plurality of active regions 102A, of which only one is illustrated in FIG. 1a, may be comprised of the basic semiconductor material of the layer 102, wherein isolation structures 102B, of which also only one is illustrated for convenience, may provide the lateral isolation of the active regions 102A. In the embodiment shown, at least a portion of the isolation structure 102B may be considered as a device region receiving one or more electronic fuses in a later manufacturing stage. On the other hand, the active region 102A may be referred to as a further device region since in and above the active region 102A a transistor is to be formed on the basis of a metal gate electrode structure. It should be appreciated that, in FIG. 1a, the regions 102A, 102B are illustrated as being positioned laterally adjacent to each other, while, in other cases, the device region 102B may be positioned at any appropriate location on the substrate 101, depending on the circuit layout of the semiconductor device 100. Furthermore, in the manufacturing stage shown, a material layer stack 110 may be formed above the active region 102A and the isolation structure 102B and may comprise a gate dielectric material 111, possibly in combination with a conductive cap material 112, such as titanium nitride and the like. As previously explained, the gate dielectric material 111 may comprise a high-k dielectric material having a dielectric constant greater than 10.0, possibly in combination with a "conventional" gate dielectric material, such as a silicon oxide-based material and the like. The thickness of the layer 111 and the material composition may be appropriately selected in order to obtain the desired electrical performance of a metal gate electrode structure to be formed above the active region 102A.

In the embodiment shown, the material layer stack 110 may further comprise a semiconductor material 113, such as an amorphous or polycrystalline silicon material, a silicon/germanium mixture and the like. It should be appreciated that the semiconductor material 113 may be provided with any desired dopant concentration as may be appropriate for forming electronic fuses and/or other circuit elements, such as resistive structures, in a later manufacturing stage, since the electronic characteristics of corresponding gate electrode structures may be adapted on the basis of materials that are to be provided in a later manufacturing stage. Similarly, a thickness of the layer 113 may be selected in accordance with process requirements, for instance so as to obtain a desired gate height of a replacement gate electrode structure, while also enabling an efficient patterning of the layer stack 110 based on given design rules for a gate length and for a width of corresponding electronic fuses to be formed above the device region 102B. Furthermore, other materials, such as a cap layer 114 and the like, may be provided in the layer stack 110, depending on the further processing of the device 100. It should be appreciated that other materials, such as hard mask materials and the like, may also be applied in order to appropriately pattern the stack 110 during the subsequent processes. For convenience, any such sacrificial materials are not shown in FIG. 1a.

The semiconductor device 100 as illustrated in FIG. 1a may be formed on the basis of any appropriate process strategy. For instance, the isolation structure 102B may be formed in the semiconductor layer 102 on the basis of any appropriate patterning strategy for forming trenches and subsequently filling the trenches with any desired insulating material, such as silicon dioxide, silicon nitride and the like. By forming isolation structures in the layer 102, the lateral position and size of active regions, such as the region 102A, may be defined. Prior to or after forming the isolation structure 102B, the basic dopant concentration may be generated in the active region 102A based on ion implantation and the like. Next, the layer stack 110 may be formed by using appropriate deposition techniques, possibly in combination with oxidation processes, in combination with additional treatments, depending on the material composition of the stack 110. For example, a basic silicon oxide material may be formed by deposition or oxidation, followed by the deposition of a high-k dielectric material, thereby providing the layer 111. As discussed above, if required, a conductive cap layer, such as the layer 112, may be formed, followed by the deposition of the semiconductor material 113, which may be accomplished by low pressure chemical vapor deposition (CVD) techniques and the like. Thereafter, any further materials, such as the cap layer 114, for instance in the form of a silicon nitride material, and any other materials may be deposited.

Figure 1B:
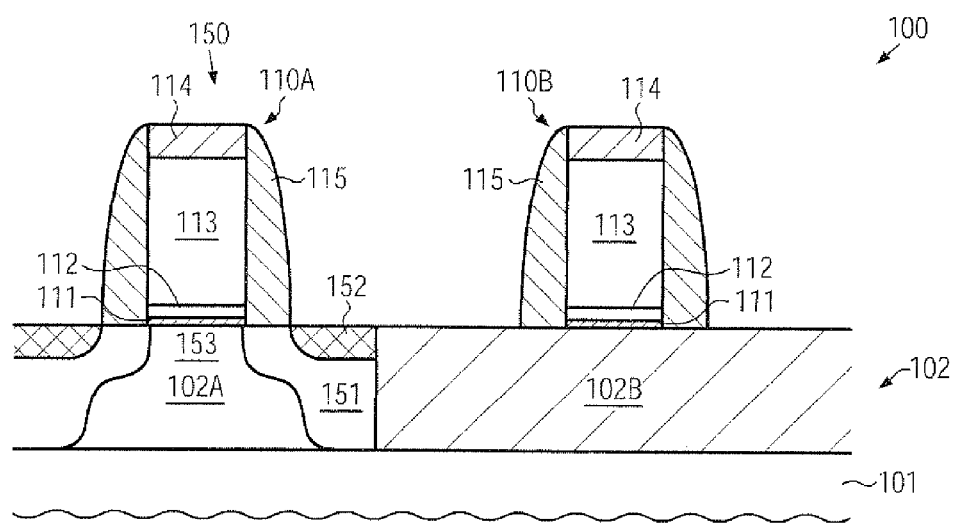

FIG. 1b schematically illustrates the semiconductor device 100 in a further advanced manufacturing stage in which a transistor 150 may be formed in and above the active region 102A. The transistor 150 may comprise a replacement gate electrode structure 110A including the materials 111, 112, 113 and 114. Furthermore, a sidewall spacer structure 115 laterally delineates the gate electrode structure 110A. A length of the gate electrode structure 110A may be substantially determined by the horizontal extension of the semiconductor material 113 and may be in the range of approximately 50 nm and less in sophisticated semiconductor devices, as is also discussed above. Furthermore, the transistor 150 may comprise drain and source regions 151 with a channel region 153 positioned between the drain region and the source region 151. Metal silicide regions 152 may be formed in a part of the drain and source regions 151, as required.

Furthermore, an electronic fuse 110B may be formed above the isolation region 102B and may comprise the materials 111, 112, 113 and 114 in combination with the sidewall spacer structure 115, wherein the components described so far of the electronic fuse 110B may also be referred to as a fuse body, since other components, such as metal conductors and the like, may have to be added in a later manufacturing stage so as to complete the electronic fuse 110B. It should be appreciated that the "width" of the electronic fuse 110B, i.e., in FIG. 1b, the horizontal extension, may differ from the length of the gate electrode structure 110A depending on the required overall electric characteristics, such as resistance value, electromigration behavior of, for instance, a portion of the conductive components of the electronic fuse 110B and the like. On the other hand, the term "length" may represent a current flow direction of the electronic fuse 110B and may represent a direction perpendicular to the drawing plane of FIG. 1b and also a horizontal direction of FIG. 1b when a non-linear configuration of the electronic fuse 110B is provided.

The semiconductor device 100 as illustrated in FIG. 1b may be formed on the basis of the following processes. The layer stack 110 (FIG. 1a) may be patterned on the basis of any appropriate lithography and etch techniques, thereby obtaining the materials 111, 112, 113 and 114 of the structures 110A, 110B with the desired lateral dimensions. Next, a portion of the sidewall spacer structure 115 may be provided, for instance in the form of a silicon nitride spacer element, and a first portion of the drain and source regions 151 may be formed by ion implantation. Thereafter, the spacer structure 115 may be provided with one or more further spacer elements (not shown) and the drain and source regions 151 may receive the required complex lateral and vertical dopant profile. It should be appreciated that additional process steps may be implemented, for instance, when incorporating a strain-inducing semiconductor material and the like, if required for enhancing performance of the transistor 150. Next, high temperature processes may be performed in order to activate dopants and re-crystallize implantation-induced damage. Next, the metal silicide regions 152 may be formed by depositing a refractory metal and initiating a chemical reaction, wherein, if desired, the layer 114 may protect the semiconductor material 113, while, in other cases, a metal silicide may be formed in the semiconductor material 113, if considered appropriate for the further processing of the device 100. After removing any excess material, the basic configuration of the transistor 150 is obtained and the further processing may be continued by depositing a portion of an interlayer dielectric material.

Figure 1C:
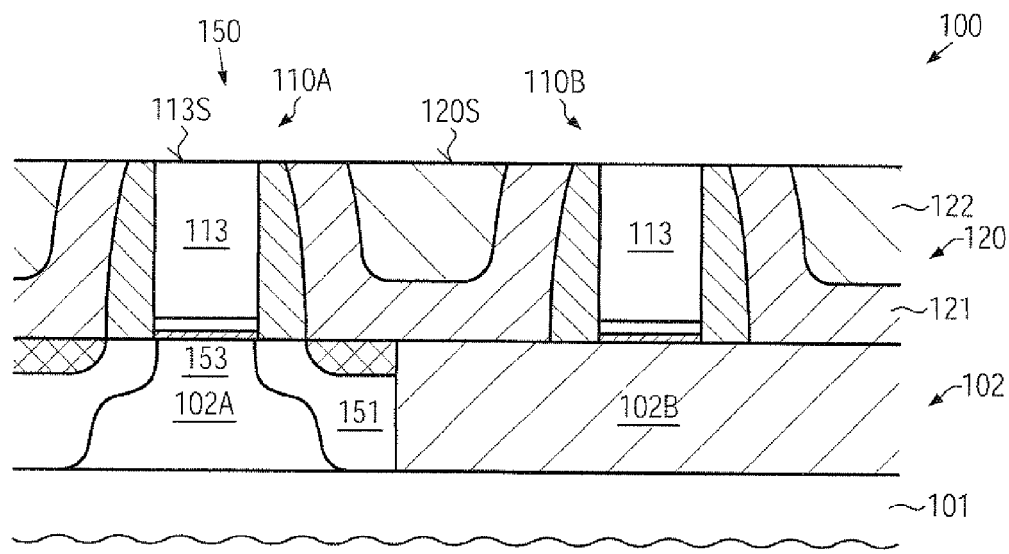

FIG. 1c schematically illustrates the semiconductor device 100 with an interlayer dielectric material 120 that laterally surrounds the gate electrode structure 110A and the electronic fuse 110B. For instance, the interlayer dielectric material 120 may comprise a first dielectric material 121, such as a silicon nitride material and the like, which may also have a high internal stress level if considered appropriate for the device 100. Furthermore, a second dielectric material 122, such as a silicon dioxide material and the like, may be provided. It should be appreciated, however, that the interlayer dielectric material 120 may have any other appropriate composition as required for obtaining the desired electrical performance of the transistor 150 and/or the electronic fuse 110B. Furthermore, in the manufacturing stage shown, the dielectric material 120 may comprise a planarized surface 120S at a height level that is appropriate to also expose a surface 113S of the semiconductor material 113 in the gate electrode structure 110A and in the electronic fuse 110B.

The semiconductor device 100 as shown in FIG. 1c may be formed by depositing the interlayer dielectric material 120 using any appropriate deposition technique, followed by a planarization process, for instance, a chemical mechanical polishing (CMP) process and the like. Consequently, upon planarizing the material 120, the surface areas 113S may be exposed.

Figure 1D:
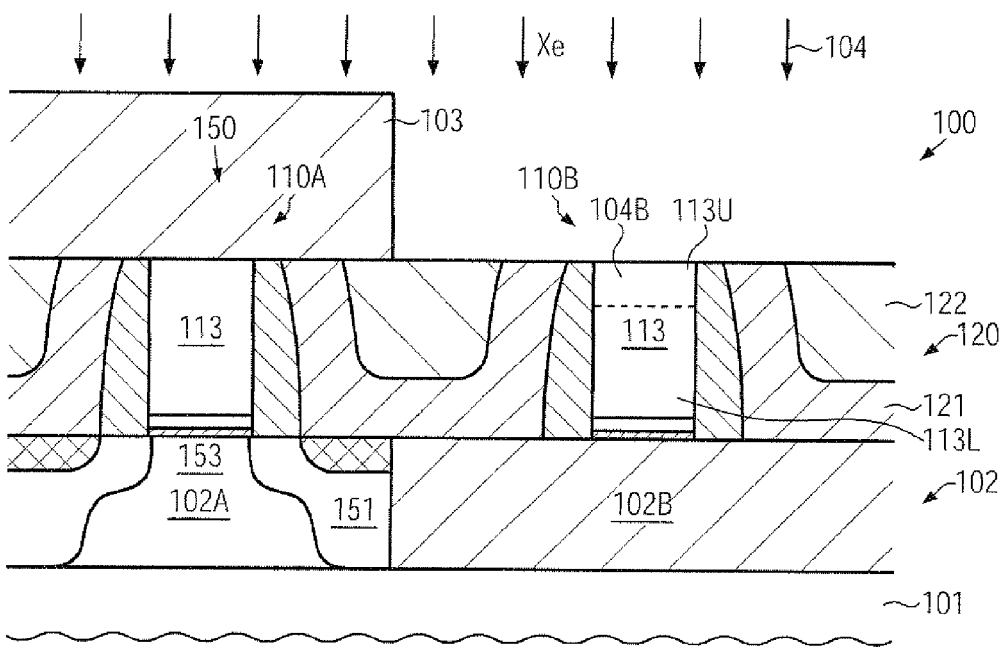

FIG. 1d schematically illustrates the semiconductor device 100 during a process 104 in order to increase an etch selectivity of the material 113 selectively in the electronic fuse 110B. In the embodiment shown, the process 104 may represent an ion implantation process for incorporating an appropriate atomic species, such as an electrically inert species, into an upper portion 113U of the semiconductor material 113, thereby imparting an increased etch resistivity to the upper portion 113U compared to a lower portion 113L. In one illustrative embodiment, a species 104B comprising xenon may be incorporated during the implantation process 104, which may thus substantially preserve the basic electronic characteristics of the material 113, while at the same significantly reducing an etch rate during a subsequent etch process. For this purpose, an appropriate implantation mask 103, such as a resist mask, may be formed so as to selectively cover the transistor 150. It should be appreciated that appropriate process parameters for the implantation process 104 may be readily established on the basis of simulations, experiments and the like, wherein a desired degree of modification of an etch rate may be determined by performing corresponding experiments using materials 113 having incorporated therein different concentrations of the species 104B. For instance, a concentration of approximately $10^{19}$-$10^{20}$ per cm$^3$ may change the etch characteristics of a silicon-based material so as to provide an efficient etch stop material with respect to a wet chemical etch recipe, for instance based on TMAH.

Figure 1E:
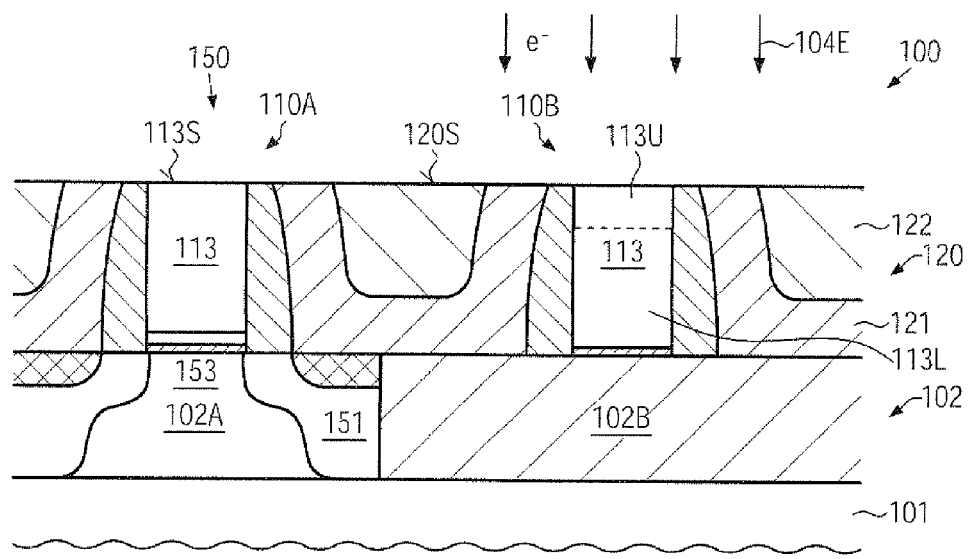
FIG. 1e schematically illustrates a cross-sectional view of the semiconductor device in which the etch resistivity of the semiconductor material is selectively increased in the electronic fuse on the basis of an electron bombardment, according to further illustrative embodiments.

FIG. 1e schematically illustrates the semiconductor device 100 according to illustrative embodiments in which the upper portion 113U of the electronic fuse 110B may be modified on the basis of an electron bombardment 104E. For this purpose, an appropriate electron source (not shown) may be used in order to obtain the desired energy density and penetration depth required for significantly modifying the etch rate in the upper portion 113U. For example, electron energies in the range of 5-50 keV or even higher may be used, wherein an exposure time may depend on the available beam current that may be applied by the electron beam source. For instance, electron microscopes may be efficiently used as an electron beam source, since these tools are typically available in semiconductor production facilities, wherein the beam current and the electron energy may be varied within a wide range. Similarly, as pointed out above with respect to the implantation process, also in this case, appropriate process parameters may be determined on the basis of simulations and/or experiments. In the embodiment shown in FIG. 1e, the electron beam 104E may be provided in a spatially restricted manner so that other device regions, such as the transistor 150, may not be affected by the beam 104E. In this manner, specific areas and thus electronic fuses may be selected so as to obtain a desired configuration on the basis of the semiconductor material 113 without requiring sophisticated lithography processes. Hence, the electron beam 104E may be positioned above the substrate 101 at any desired position in order to prepare corresponding structures, such as the electronic fuse 110B, for the subsequent wet chemical etch process in which the semiconductor material 113 is to be removed from the transistor 150.

In other illustrative embodiments, a mask, such as the mask as shown in FIG. 1d, may be provided so as to expose the electronic fuse 110B to the electron beam 104E and this beam may not be provided with a high spatial resolution. For example, a moderately laterally large electron beam may be scanned across the substrate 101 or an electron shower may be produced so as to be applied to large portions or the entire substrate 101. Consequently, the electron bombardment 104E may be applied when the surface areas 113S are substantially exposed, thereby modifying the etch resistivity of the upper portion 113U with high efficiency.

Figure 1F:
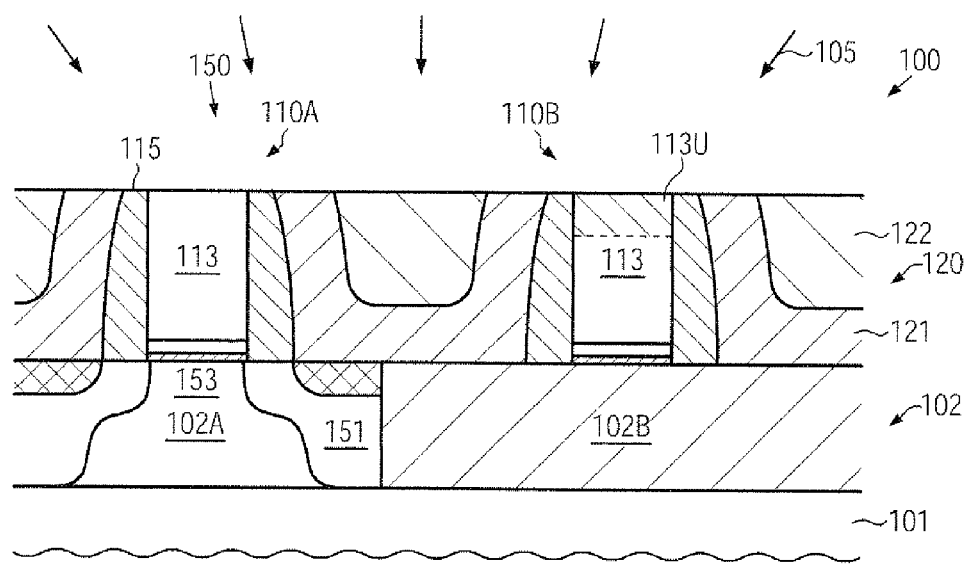
FIGS. 1f-1h schematically illustrate cross-sectional views of the semiconductor device in further advanced manufacturing stages in which a metal-containing electrode material is selectively provided in the gate electrode structure, according to illustrative embodiments.

FIG. 1f schematically illustrates the semiconductor device 100 in a further advanced manufacturing stage when exposed to a wet chemical etch ambient 105, for instance established on the basis of TMAH, in order to efficiently remove the material 113 from the gate electrode structure 110A. On the other hand, the material 113 in the electronic fuse 110B is substantially preserved due to the presence of the modified upper portion 113U having the increased etch resistivity. As previously explained, TMAH may also exhibit a high degree of selectivity with respect to dielectric materials, such as silicon dioxide, silicon nitride and the like, so that the interlayer dielectric material 120 and the spacer structure 115 may act as sufficient etch stop materials. Due to the upper portion 113U, the material 113 may be substantially preserved in the electronic fuse 110B, which may be understood such that less than approximately 10 percent of the initial material 113 of the electronic fuse 110B may be removed during the etch process 105. In other cases, less than approximately 5% of the initial amount of the material 113 may be removed during the process 105 due to the modified upper portion 113U.

Figure 1G:
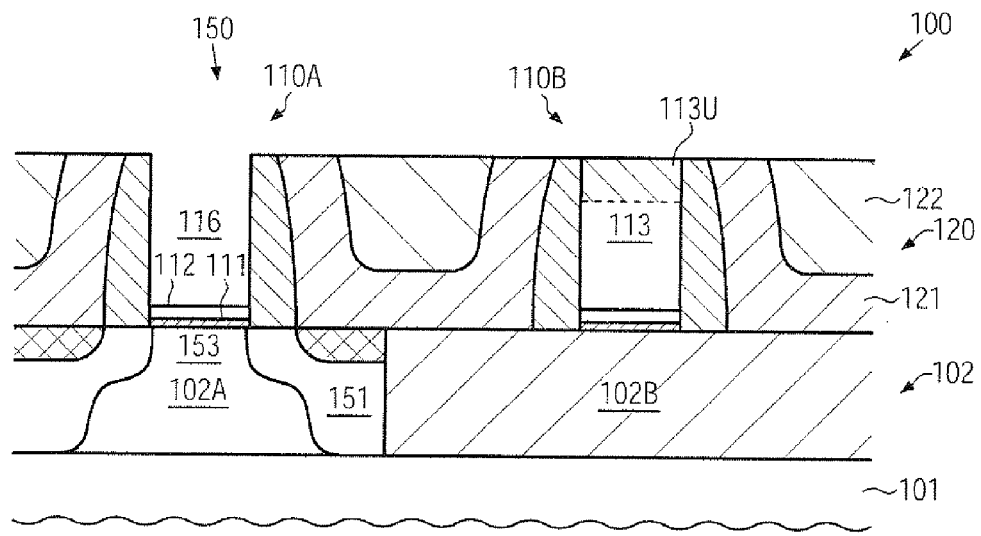

FIG. 1g schematically illustrates the semiconductor device 100 with an opening 116 formed in the gate electrode structure 110A due to the removal of the material 113. It should be appreciated that the layer 112 may act as an efficient protection layer upon forming the opening 116 during the etch process 105 of FIG. 1e. In other cases, if required, the layer 112 may be removed upon forming the opening 116 and may be replaced by any other appropriate material, such as a high-k dielectric material and the like, if such a material is not yet incorporated in the layer 111.

Subsequently, any further material or materials may be filled into the opening 116, such as a work function adjusting species, possibly in combination with other conductive materials, such as titanium nitride, tantalum nitride and the like. It should be appreciated that, typically, P-channel transistors and N-channel transistors may require different types of conductive materials to be filled in the openings 116 in order to obtain an appropriate work function for these different transistor elements. Consequently, depending on the process strategy, materials may be deposited and may be selectively removed, followed by the deposition of a further material, depending on the overall process strategy for providing the different work function materials. Thereafter, a desired electrode material may be deposited.

Figure 1H:
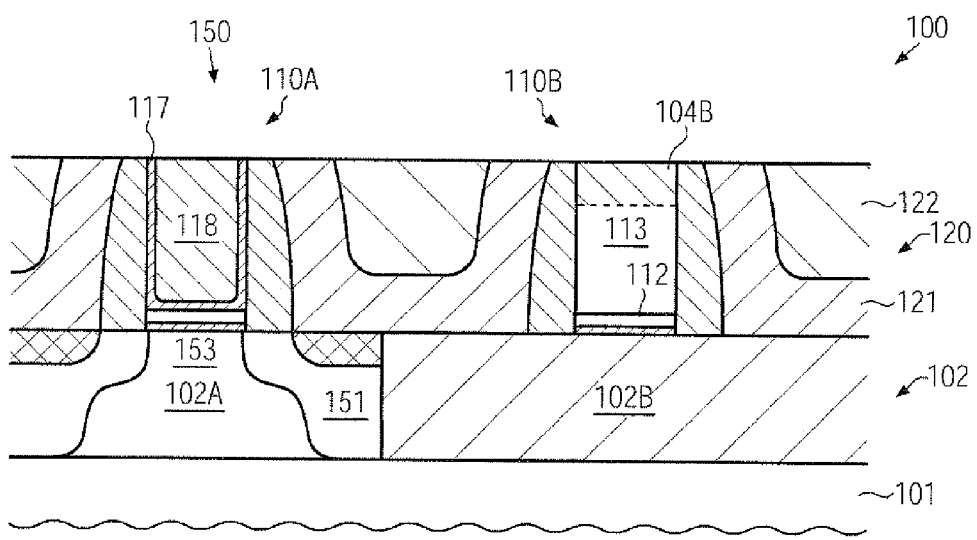

FIG. 1h schematically illustrates the semiconductor device 100 in a further advanced manufacturing stage in which one or more material layers 117 may be formed in the gate electrode structure 110A, which may comprise a work function adjusting species, such as lanthanum, aluminum and the like, possibly in combination with additional conductive barrier or etch stop materials, followed by an electrode material 118, such as aluminum and the like. On the other hand, the electronic fuse 110B may comprise the semiconductor material 113 which may thus determine the overall electrical behavior of the structure 110B in combination with the geometric configuration. As previously indicated, a plurality of well-established designs of electronic fuses may be available for polysilicon-based semiconductor devices and any such designs may basically be used when compatible with the overall configuration of the semiconductor device 100. Consequently, the electronic fuse 110B may be provided on the basis of well-established design criteria of semiconductor-based fuse structures without requiring significant modifications, while also avoiding complex dielectric diffusion barriers, as may typically be required in conventional strategies when using metal-based fuses in combination with a copper metallization.

It should be appreciated that the etch resistivity of the material 113 of the electronic fuse 110B may be modified at any appropriate manufacturing stage when an implantation process may be used to incorporate a desired concentration in the upper portion 113U. For this purpose, the implantation parameters, such as implantation energy, may be readily adapted so as to take into consideration the presence of any further materials provided above the semiconductor material 113.

Figure 1I:
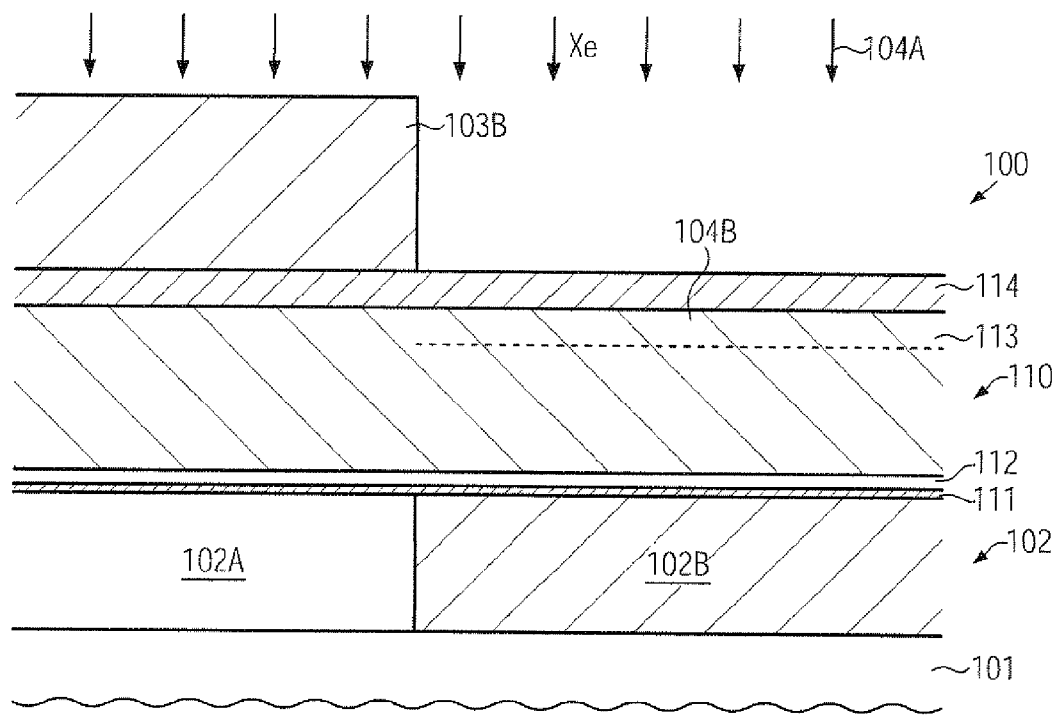
FIGS. 1i-1j schematically illustrate cross-sectional views of the semiconductor device according to illustrative embodiments in which the etch resistivity may be selectively adjusted in an early manufacturing stage.

FIG. 1i schematically illustrates the semiconductor device 100 according to illustrative embodiments in which the etch resistivity of the material 113 may be selectively increased in an early manufacturing stage, i.e., prior to actually patterning the gate electrode structure 110A and the electronic fuse 110B (FIG. 1b). As illustrated, an implantation mask 103B, such as a resist mask, is formed so as to expose a portion of the layer stack 110 above the isolation structure 102B. Due to the presence of additional materials of the layer stack 110, such as the cap layer 114, process parameters, i.e., the implantation energy of the process 104A, may be appropriately adjusted in order to incorporate the species 104B in the semiconductor layer 113. Appropriate process parameters may be readily determined by simulation, experiments and the like. After the implantation process 104A, the mask 103B may be efficiently removed, while the cap layer 114 may preserve integrity of the material 113. The further processing may then be continued, as is described above with reference to FIGS. 1a and 1b in order to pattern the gate electrode structure 110A and the electronic fuse 110B, which may have incorporated therein the implantation species 104B, thereby imparting the increased etch resistivity to the material 113 selectively in the electronic fuse 110B (FIG. 1h).

Figure 1J:
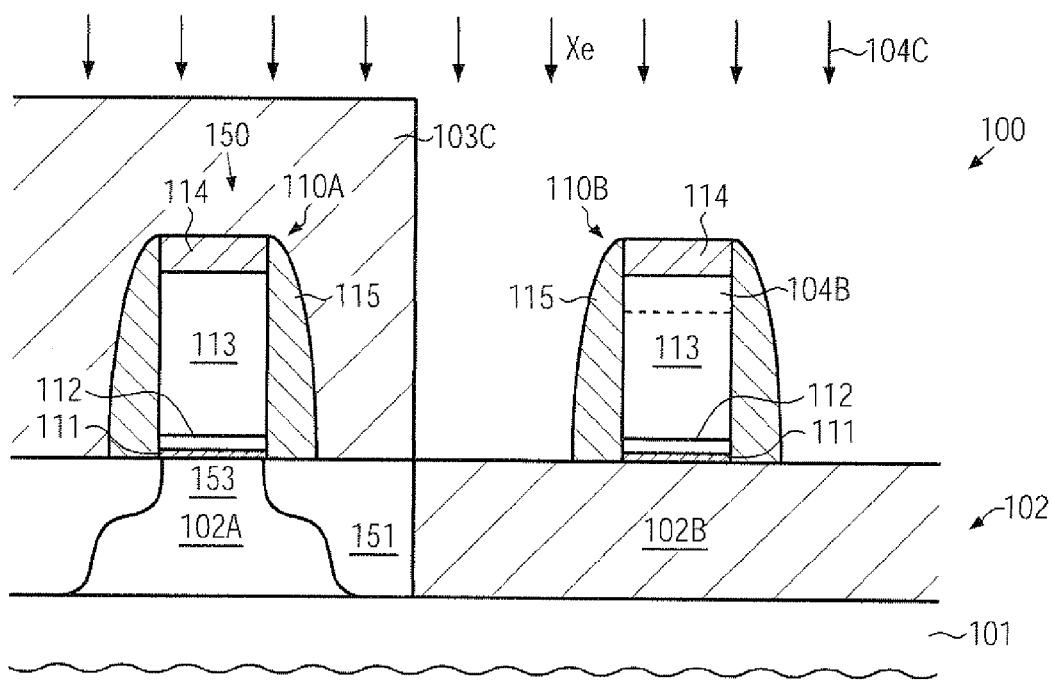

FIG. 1j schematically illustrates the semiconductor device 100 according to a further illustrative embodiment in which an implantation process 104C may be performed in a manufacturing stage after forming the gate electrode structure 110A and the electronic fuse 110B and prior to depositing an interlayer dielectric material. As illustrated, an implantation mask 103C may cover the electrode structure 110A and the active region 102A and may expose the electronic fuse 110B and the isolation region 102B. The implantation species 104B may thus be selectively incorporated into the semiconductor material 113 of the electronic fuse 110B, wherein process parameters may be adapted so as to take into consideration the presence of the cap layer 114. After removing the implantation mask 103C, the further processing may be continued, for instance, by forming metal silicide regions and depositing an interlayer dielectric material.

Consequently, a high degree of flexibility in scheduling the overall manufacturing process may be obtained on the basis of an ion implantation process for modifying the etch resistivity of the semiconductor material 113 selectively in the electronic fuse 110B.

Figure 1K:
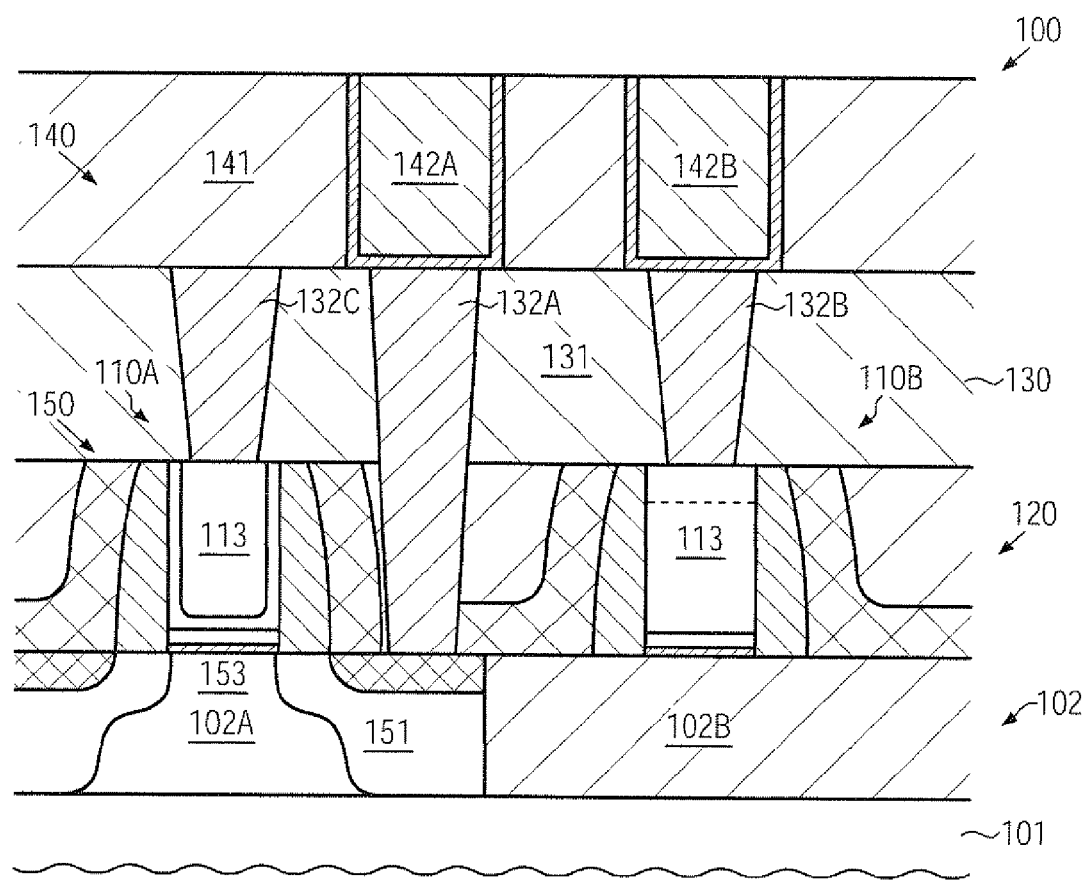
FIG. 1k schematically illustrates a cross-sectional view of the semiconductor device in a further advanced manufacturing stage in which a transistor and an electronic fuse are connected to a metallization system, according to illustrative embodiments.

FIG. 1k schematically illustrates the semiconductor device 100 in a further advanced manufacturing stage. As illustrated, a contact level 130 may be formed above the transistor 150 and the electronic fuse 110B and may comprise any appropriate dielectric material 131, such as a silicon dioxide material and the like, in which contact elements 132A, 132C, 132B are provided in order to establish an electrical connection to the transistor 150 and to the electronic fuse 110B. The contact elements 132A, 132B, 132C may be formed on the basis of well-established process strategies and may comprise any appropriate conductive material, such as tungsten, copper, aluminum and the like, possibly in combination with appropriate conductive barrier materials (not shown). Furthermore, a metallization layer 140 may be formed above the contact level 130 and may comprise an appropriate dielectric material 141 and metal regions 142A, 142B in order to appropriately connect the transistor 150 to other circuit elements (not shown) and also to connect the electronic fuse 110B to a control circuit (not shown) in order to provide appropriate voltage and current pulses and also to determine the state of the electronic fuse 110B, as is also previously discussed. The metallization layer 140 may comprise the dielectric material 141, for instance in the form of a low-k dielectric material in combination with highly conductive metals such as copper and the like which may require another confinement material, for instance based on conductive and/or dielectric diffusion barrier layers.

The contact level 130 and the metallization layer 140 may be formed on the basis of any appropriate process strategy wherein, due to well-established configuration of the electronic fuse 110B comprising the semiconductor material 113, an extremely high current density and thus very high temperatures locally in the vicinity of the electronic fuse 110B may be suppressed, thereby not requiring a superior diffusion blocking effect between the devices 150 and 110B and copper-containing metallization structures.

As a result, the present disclosure provides semiconductor devices and manufacturing techniques in which electronic fuses and also other semiconductor-based circuit elements may be formed on the basis of a semiconductor electrode material, while complex gate electrode structures may be provided on the basis of a replacement gate approach so as to obtain a metal-containing electrode material in an advanced manufacturing stage. For this purpose, the etch resistivity of an upper portion of the semiconductor material may be selectively increased in the electronic fuses or other semiconductor-based circuit elements by incorporating an atomic species such as xenon by ion implantation or by modifying the surface characteristics on the basis of an electron bombardment at an appropriate manufacturing stage. For example, the electron bombardment may be applied at any manufacturing stage in which the surface of the semiconductor material may be exposed, while on the other hand an implantation process may be performed at any appropriate manufacturing stage, wherein the presence of any further materials formed above the semiconductor material may be taken into consideration by appropriately adapting the implantation parameters. Consequently, the etch resistivity of the semiconductor material may be appropriately spatially patterned without requiring the provision of any hard mask materials, which may otherwise result in a very complex removal process. In some illustrative embodiments, spatial patterning of the etch resistivity may be accomplished without providing any mask material, such as a resist material, by using a spatially restricted electron beam.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of forming an electronic fuse of a semiconductor device, the method comprising:
   forming a layer stack above a first device region and a second device region of said semiconductor device, said layer stack comprising a high-k dielectric material and a semiconductor material;
   forming a replacement gate electrode structure above said first device region and a fuse body above said second device region from said layer stack;
   increasing an etch resistivity of said semiconductor material selectively in said fuse body; and
   performing a wet chemical etch process to remove said semiconductor material selectively in said replacement gate electrode structure, while substantially maintaining said semiconductor material having the increased etch resistivity in said fuse body.

2. The method of claim 1, wherein increasing an etch resistivity comprises performing an ion implantation process so as to incorporate an electrically inert species into said semiconductor material selectively above said second device region.

3. The method of claim 2, wherein said electrically inert species comprises xenon.

4. The method of claim 1, wherein increasing an etch resistivity comprises performing an electron bombardment selectively above said second device region.

5. The method of claim 4, wherein performing an electron bombardment comprises directing a locally restricted electron beam to said second device region without masking said first device region.

6. The method of claim 1, further comprising forming a transistor on the basis of said replacement gate electrode structure, forming a dielectric material above said transistor and said fuse body and selectively replacing said semiconductor material after forming said dielectric material.

7. The method of claim 6, wherein said etch resistivity is increased after forming said dielectric material.

8. The method of claim 7, further comprising planarizing said dielectric material and exposing said semiconductor material of said replacement gate electrode structure and of said fuse body and wherein said etch resistivity is increased after planarizing said dielectric material.

9. The method of claim 6, wherein said etch resistivity is increased prior to forming said dielectric material.

10. The method of claim 9, wherein said etch resistivity is increased prior to forming said replacement gate electrode structure.

11. The method of claim 1, wherein forming said material layer stack comprises forming a conductive cap layer above said high-k dielectric material.

12. The method of claim 11, wherein forming said fuse body comprises removing at least said conductive cap layer from above said second device region prior to forming said replacement gate electrode structure and said fuse body.

* * * * *